US010827638B2

(12) United States Patent
Horikoshi et al.

(10) Patent No.: US 10,827,638 B2
(45) Date of Patent: Nov. 3, 2020

(54) ELECTRIC DEVICE AND MOTOR DRIVING DEVICE

(71) Applicant: FANUC CORPORATION, Yamanashi (JP)

(72) Inventors: Shinichi Horikoshi, Yamanashi-ken (JP); Yuuya Nakagawa, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/245,759

(22) Filed: Jan. 11, 2019

(65) Prior Publication Data
US 2019/0230809 A1 Jul. 25, 2019

(30) Foreign Application Priority Data
Jan. 19, 2018 (JP) ................... 2018-006951

(51) Int. Cl.
*H05K 7/00* (2006.01)
*H05K 7/14* (2006.01)
*H05K 1/14* (2006.01)
*H05K 3/36* (2006.01)
*H05K 1/02* (2006.01)
*H05K 1/18* (2006.01)

(52) U.S. Cl.
CPC ......... *H05K 7/1427* (2013.01); *H05K 1/0263* (2013.01); *H05K 1/14* (2013.01); *H05K 1/18* (2013.01); *H05K 3/36* (2013.01); *H05K 7/1432* (2013.01); *H05K 2201/09818* (2013.01)

(58) Field of Classification Search
CPC ...... H05K 7/1427; H05K 7/1432; H05K 1/14; H05K 3/36; H05K 1/0263; H05K 1/18; H05K 2201/09818; H05K 3/0064; H05K 1/142; H05K 2201/10409; H05K 2201/10272; H05K 7/06
See application file for complete search history.

(56) References Cited

U.S. PATENT DOCUMENTS

| 4,853,828 A * | 8/1989 | Penn ..................... H05K 1/0204 |
| | | 361/717 |
| 7,207,187 B2 * | 4/2007 | Funahashi ............... F01C 21/10 |
| | | 62/113 |
| 2005/0112956 A1 | 5/2005 | Tsugane et al. |
| 2005/0185387 A1 | 8/2005 | Suzuki et al. |

(Continued)

FOREIGN PATENT DOCUMENTS

| CN | 1761377 A | 4/2006 |
| CN | 102991569 A | 3/2013 |

(Continued)

OTHER PUBLICATIONS

Japanese Office Action issued by the Japanese Patent Office in relation to Japanese Application No. 2018-006951 dated Sep. 17, 2019 (3 pages) along with English language machine translation (4 pages).

*Primary Examiner* — Yuriy Semenenko
(74) *Attorney, Agent, or Firm* — Robert P. Michal, Esq.; Carter, DeLuca & Farrell LLP

(57) ABSTRACT

A motor driving device includes a printed board on which a pattern is printed, and a resin board which is formed by molding a resin and on which no pattern is printed, and the printed board is provided on the resin board.

7 Claims, 2 Drawing Sheets

(56) References Cited

U.S. PATENT DOCUMENTS

| | | | |
|---|---|---|---|
| 2009/0122505 A1* | 5/2009 | Lu ........................ | H05K 1/0271 |
| | | | 361/809 |
| 2013/0033842 A1* | 2/2013 | Hara ...................... | H05K 1/183 |
| | | | 361/803 |
| 2017/0042053 A1* | 2/2017 | Soyano ................ | H05K 5/0004 |

FOREIGN PATENT DOCUMENTS

| | | |
|---|---|---|
| CN | 107431418 A | 12/2017 |
| JP | S60181090 U | 12/1985 |
| JP | S6324808 A | 10/1988 |
| JP | H02129763 U | 10/1990 |
| JP | 2129763 * | 11/1990 |
| JP | H03126093 U | 12/1991 |
| JP | H07241786 A | 9/1995 |
| JP | 2004-147416 A | 5/2004 |
| JP | 2004336945 A | 11/2004 |
| JP | 2005-243742 A | 9/2005 |
| JP | 2006-286768 A | 10/2006 |

* cited by examiner

ELECTRIC DEVICE AND MOTOR DRIVING DEVICE

CROSS-REFERENCE TO RELATED APPLICATION

This application is based upon and claims the benefit of priority from Japanese Patent Application No. 2018-006951 filed on Jan. 19, 2018, the contents of which are incorporated herein by reference.

BACKGROUND OF THE INVENTION

Field of the Invention

The present invention relates to an electric device and a motor driving device having a printed board on which a pattern is printed.

Description of the Related Art

Japanese Laid-Open Patent Publication No. 2005-243742 discloses a motor driving device in which short bars are mounted on a printed board.

SUMMARY OF THE INVENTION

According to the technique described in Japanese Laid-Open Patent Publication No. 2005-243742, it is necessary to ensure an area for the provision of the short bars on the printed board, and thus enlarging the area of the printed board, whose unit price per area is high, may increase manufacturing costs of the motor driving device.

The present invention has been made to solve the problem above, and an object of the present invention is to provide an electric device and a motor driving device capable of suppressing manufacturing costs.

According to a first aspect of the present invention, an electric device includes a printed board on which a pattern is printed; and a resin board which is formed by molding a resin and on which no pattern is printed, and the printed board is provided on the resin board.

According to the present invention, it is possible to reduce the area of the printed board with a high unit price, so as to suppress manufacturing costs.

The above and other objects, features, and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

First Embodiment

[Configuration of Motor Driving Device]

Figure 1:
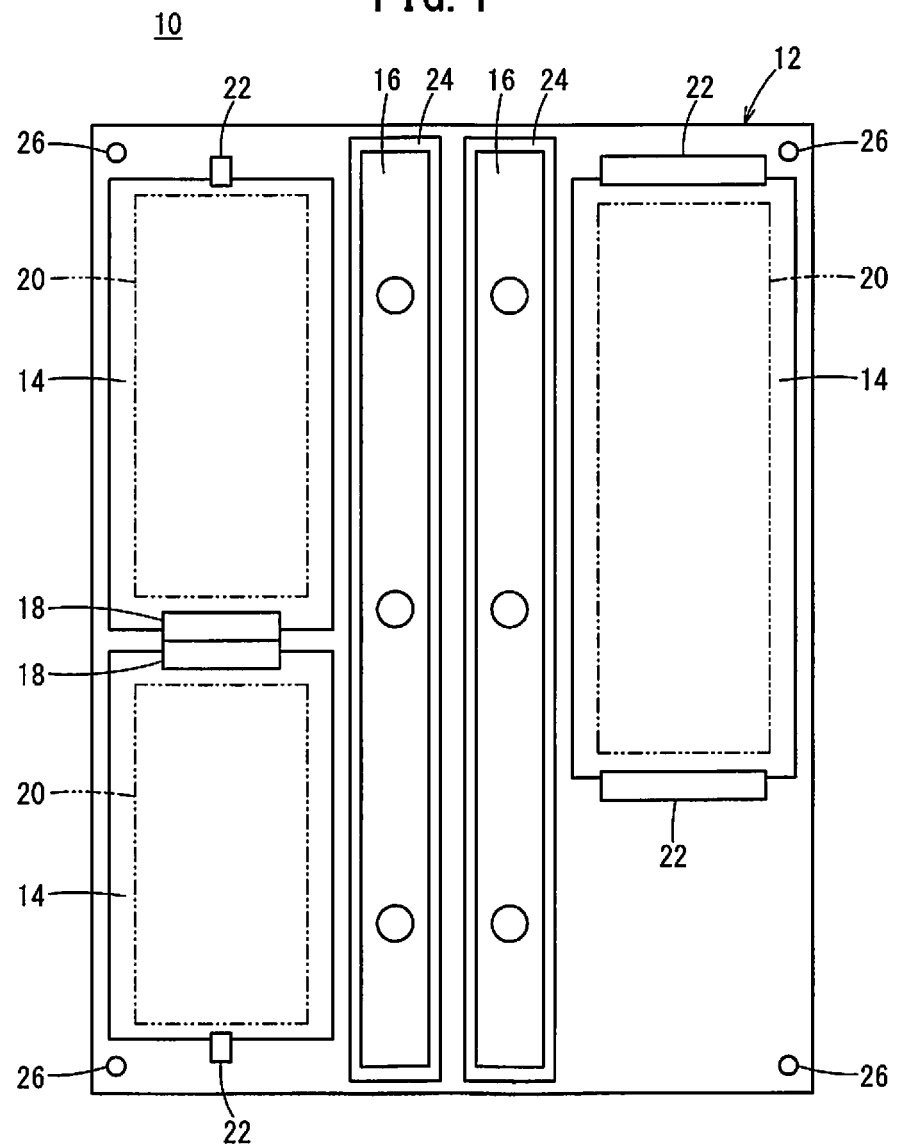
FIG. 1 is a schematic diagram showing the internal structure of a motor driving device.

FIG. 1 is a schematic diagram showing the internal structure of a motor driving device 10. The motor driving device 10 is a device which controls electric power supplied to a motor not shown. The motor driving device 10 includes a resin board 12, printed boards 14 provided on the resin board 12, and short bars 16 also provided on the resin board 12.

The resin board 12 is a plate-shaped member produced by injection molding of a resin material. The printed boards 14 are plate-shaped members produced by printing a pattern on a stack of laminated plates formed of resin.

Mounted on the printed boards 14 are control units 20 composed of a plurality of electronic elements and configured to control power supplied to the motor, connectors 18 for making electrical connections with other printed boards 14, and so on. The short bars 16 are connected to a power device (not shown), and a current larger than a current passed through the control units 20 is passed through the short bars 16. The resin board 12 is provided with wiring for connecting the printed boards 14 and the power device, and the like, but no pattern is printed on the resin board 12.

The resin board 12 has first positioning portions 22 for positioning the printed boards 14. The first positioning portions 22 are formed by snap-fit, for example, and the first positioning portions 22 fix the printed boards 14 to the resin board 12.

The resin board 12 has second positioning portions 24 for positioning the short bars 16. The second positioning portions 24 are formed in a groove-like manner along the shape of the short bars 16. The short bars 16 are coupled to the power device by bolts not shown.

The resin board 12 has formed therein a plurality of screw insertion holes 26 in which screws for fixing the resin board 12 to a housing (not shown) are inserted. In the production of the motor driving device 10, first, the printed boards 14 and the short bars 16 are mounted on the resin board 12. Then, the resin board 12 is moved into the housing, and the resin board 12 is fixed to the housing with screws.

[Functions and Effects]

Figure 2:
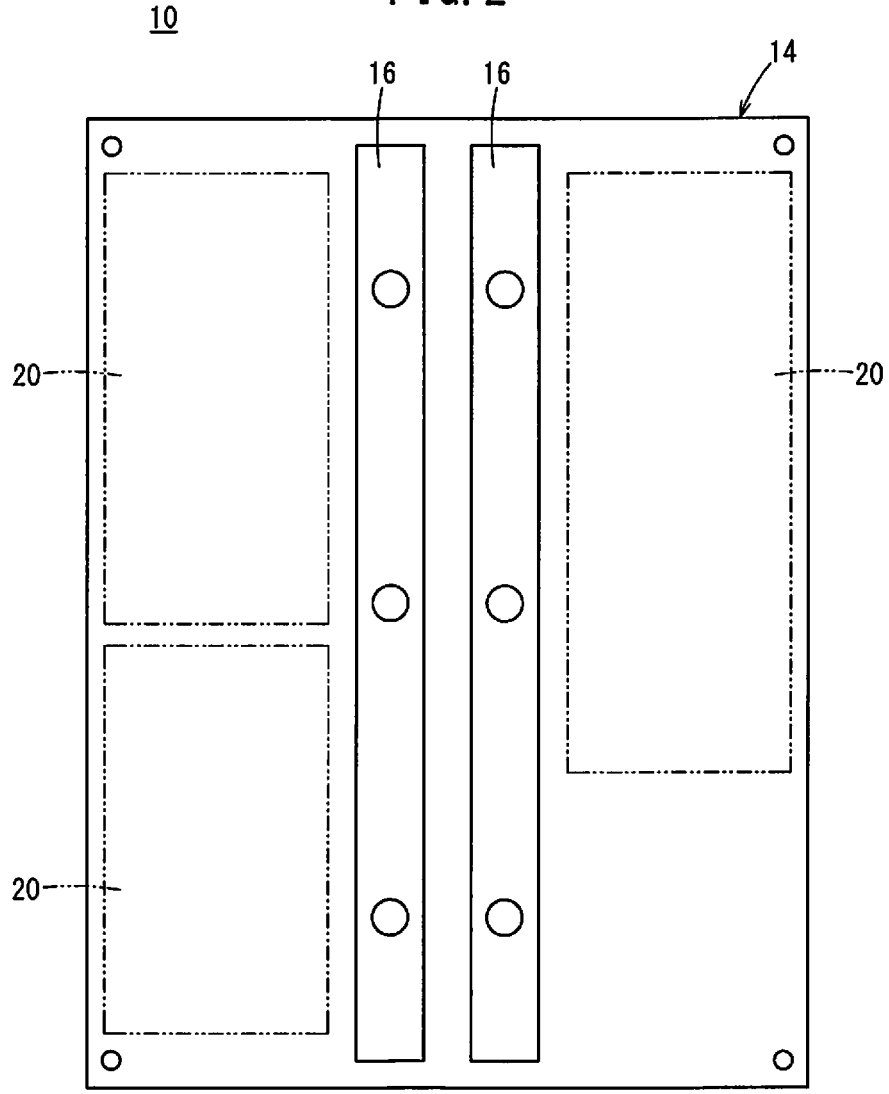
FIG. 2 is a schematic diagram showing the internal structure of a conventional motor driving device.

FIG. 2 is a schematic diagram showing the internal structure of a conventional motor driving device 10. Conventionally, short bars 16 are provided on a printed board 14, and the printed board 14 is fixed to a housing by screws. Accordingly, it is necessary to secure on the printed board 14 an area for the provision of the short bars 16, in addition to areas for the provision of control units 20. Furthermore, improving the work efficiency of screwing of the printed board 14 to the housing requires reducing the number of printed boards 14, and it may be necessary in some cases that the printed board 14 have an area larger than an area of the regions in which the control units 20 are actually provided. However, the unit price per area of the printed board 14 is high, and manufacturing costs of the motor driving device 10 will be increased.

Accordingly, in this embodiment, the printed boards 14 and the short bars 16 are mounted on the resin board 12 formed by injection molding. Thus, it is only necessary to secure areas for provision of the control units 20 on the printed boards 14, which makes it possible to reduce the area of the printed boards 14 and thereby suppress manufacturing costs of the motor driving device 10. The resin board 12 can be fixed to the housing with the printed boards 14 and the short bars 16 mounted on the resin board 12, and therefore efficiency in assembling the motor driving device 10 is also ensured.

Furthermore, the resin board 12 includes the first positioning portions 22 for positioning the printed boards 14 and the second positioning portions 24 for positioning the short bars 16. Owing to this, it is possible to further facilitate mounting of the printed boards 14 and the short bars 16 on the resin board 12.

The present embodiment has described the motor driving device 10, but a configuration in which a printed board 14 is provided on a resin board 12 can be applied also to devices for supplying electric power to other equipment, so as to reduce the area of the printed board 14 and suppress manufacturing costs.

Technical Ideas Obtained by Present Embodiment

Technical ideas obtained by the above-described embodiment will be described below.

The electric device (10) includes a printed board (14) on which a pattern is printed; and a resin board (12) which is formed by molding a resin and on which no pattern is printed, and the printed board (14) is provided on the resin board (12). This makes it possible to reduce the area of the printed board (14) and thereby suppress manufacturing costs of the electric device (10).

In the electric device (10) above, the resin board (12) may include a first positioning portion (22) configured to position the printed board (14). This can further facilitate mounting of the printed board (14) on the resin board (12).

The electric device (10) above may further include a short bar (16) through which a current larger than a current passed through the pattern of the printed board (14) is passed, and the short bar (16) may be provided on the resin board (12). This makes it possible to reduce the area of the printed board (14) and thereby suppress manufacturing costs of the electric device (10).

In the electric device (10) above, the resin board (12) may include a second positioning portion (24) configured to position the short bar (16). This improves facility of mounting of the short bar (16) on the resin board (12).

The electric device (10) described above may be a motor driving device (10) for supplying electric power to a motor, and a control unit (20) configured to control the electric power supplied to the motor may be mounted on the printed board (14). This makes it possible to reduce the area of the printed board (14) and thereby suppress manufacturing costs of the motor driving device (10).

The present invention is not particularly limited to the embodiments described above, and various modifications are possible without departing from the essence and gist of the present invention.

What is claimed is:

1. An electric device comprising:
   a printed board on which a pattern is printed;
   a resin board which is formed by molding a resin and on which no pattern is printed; and
   a short bar through which a current larger than a current passed through the pattern of the printed board is passed,
   wherein the printed board is provided on the resin board, and
   the short bar is provided outside a region on the resin board, the region being where the printed board is mounted, wherein the short bar is disposed outside of an outer periphery of the printed board.

2. The electric device according to claim 1, wherein the resin board includes a first positioning portion configured to position the printed board.

3. The electric device according to claim 1, wherein the resin board includes a second positioning portion configured to position the short bar.

4. A motor driving device for supplying electric power to a motor, the motor driving device being the electric device according to claim 1,
   wherein a control unit configured to control electric power supplied to the motor is mounted on the printed board.

5. The electric device according to claim 1, wherein the short bar has a lower surface, and an opposite upper surface facing away from the resin board, the lower and upper surfaces of the short bar being out of overlapping alignment with the printed board.

6. The electric device according to claim 1, wherein the printed board is a plurality of printed boards mounted on the resin board.

7. The electric device according to claim 1, wherein the printed board has a smaller area than the resin board.

* * * * *